(12) United States Patent
Hsiao

(10) Patent No.: US 10,517,192 B2
(45) Date of Patent: Dec. 24, 2019

(54) BENDABLE HEAT PLATE

(71) Applicant: GETAC TECHNOLOGY CORPORATION, Hsinchu County (TW)

(72) Inventor: Wei-Chung Hsiao, Taipei (TW)

(73) Assignee: GETAC TECHNOLOGY CORPORATION, Hsinchu County (TW)

( * ) Notice: Subject to any disclaimer, the term of this patent is extended or adjusted under 35 U.S.C. 154(b) by 0 days.

(21) Appl. No.: 15/917,539

(22) Filed: Mar. 9, 2018

(65) Prior Publication Data
US 2019/0124791 A1    Apr. 25, 2019

(30) Foreign Application Priority Data
Oct. 25, 2017    (TW) .............................. 106136662 A

(51) Int. Cl.
| | |
|---|---|
| *H05K 7/20* | (2006.01) |
| *F28D 15/04* | (2006.01) |
| *F28D 15/02* | (2006.01) |
| *H01L 23/427* | (2006.01) |

(52) U.S. Cl.
CPC ....... *H05K 7/20336* (2013.01); *F28D 15/025* (2013.01); *F28D 15/0233* (2013.01); *F28D 15/0241* (2013.01); *F28D 15/04* (2013.01); *F28F 2255/02* (2013.01); *H01L 23/427* (2013.01)

(58) Field of Classification Search
CPC . H05K 7/20336; F28D 15/04; F28D 15/0241; F28D 15/0233; F28F 2255/02; H01L 23/427
USPC ............................................... 165/104.26, 46
See application file for complete search history.

(56) References Cited

U.S. PATENT DOCUMENTS

| | | | | |
|---|---|---|---|---|
| 3,913,665 A * | 10/1975 | Franklin | ............. | F28D 15/0241 165/104.26 |
| 4,212,347 A * | 7/1980 | Eastman | ............. | F28D 15/0241 165/104.26 |
| 5,560,423 A * | 10/1996 | Larson | ................ | F28D 15/0241 165/104.26 |
| 7,891,413 B2 * | 2/2011 | Liu | ........................ | F28D 15/046 165/104.21 |
| 9,315,280 B2 * | 4/2016 | Ambrose | ............. | F28D 15/046 |
| 10,184,729 B2 * | 1/2019 | Inagaki | ................. | F28D 15/046 |
| 2006/0144561 A1 * | 7/2006 | Lin | ........................ | H01L 23/427 165/104.33 |

* cited by examiner

Primary Examiner — Leonard R Leo

(57) ABSTRACT

A bendable heat plate is provided. The heat plate includes a housing, a micro-structural layer and a fluid. The housing has an inner surface and an enclosed internal space, and includes a bendable section provided with a channel maintaining structure. The micro-structural layer is formed on the inner surface of the housing. The fluid is filled in the internal space. Using the channel maintaining structure, the bendable section is provided with sufficient space for the fluid to pass through.

9 Claims, 8 Drawing Sheets

BENDABLE HEAT PLATE

CROSS REFERENCE TO RELATED APPLICATIONS

This Application claims priority of Taiwan Patent Application No. 106136662 filed on Oct. 25, 2017, the entirety of which is incorporated by reference herein.

BACKGROUND OF THE INVENTION

Field of the Invention

The invention relates to a heat plate, and more particularly, to a bendable heat plate for adhering on a heat emitting element and assisting heat dissipation of the heat emitting element.

Description of the Prior Art

During operations of an electronic device, electronic components therein generate large amounts of heat. A conventional heat plate, usually adhered to an electronic component (e.g., a central processor), is used to dissipate heat generated by the electronic component. More specifically, a conventional heat plate includes two mutually joined plate bodies to jointly define an enclosed space for accommodating a fluid. Thus, such conventional heat plate appears as a flat plate, and has a larger area compared to the area of the electronic component. For example, when the heat plate is adhered to an electronic component, the heat generated by the electronic component is transmitted to a heat absorbing area of the heat plate, and the fluid in the enclosed space comes into contact with the heat energy and is transformed to gas, which then flows to a space that is not in contact with the electronic component to withdraw the heat energy. The temperature of a condensation area that is not in contact with the electronic component is lower, and thus the gas is again condensed to liquid. The liquid flows back to the heat absorbing area through a capillary structure to again absorb the heat from the heat source and becomes gas. The above process is cyclically performed to dissipate heat of the electronic component.

To enhance the heat dissipation efficiency of the heat plate, one method is directly deploying a cooling fin outside the condensation area. However, such method increases the overall volume and thickness, which disfavors the trend of being lightweight and slim. In another method, an attempt for guiding the heat to other regions is made. However, limited by the flat plate shape of the heat plate, internal structures can collapse or a surrounding sealing structure can be damaged easily if the heat plate is bent. One solution for this issue is, for example, configuring a bendable hot tube adhered outside the condensation area to guide the heat to other regions to dissipate the heat. However, this method increases production costs and results in degraded heat dissipation efficiency.

Therefore, there is a need and potential for a bendable heat plate in the related technical field and industry.

SUMMARY OF THE INVENTION

It is a primary object of the present invention to provide a bendable heat plate. The bendable heat plate includes a housing and a channel maintaining structure. The housing includes a plurality of flat sections and a bendable section located between the flat sections. The bendable section is provided by means of the channel maintaining structure so as to ensure that the bendable section has sufficient internal space for a fluid to pass through and to maintain good heat dissipation performance.

It is another object of the present invention to provide an included angle of between 0° and 180° between any two adjacent flat sections, wherein the any two adjacent flat sections are preferably perpendicular to each other. By adhering one of the flat sections of the housing that is parallel to a horizontal plane to an electronic component, the heat of the electronic component is transmitted to the heat plate. Liquid in the heat plate is transformed to gas, which simultaneously carries the heat energy, passes through the bendable section and flows vertically to the other flat section parallel to a vertical plate, thus quickly withdrawing the heat energy.

To achieve the above objects, the present invention provides a bendable heat plate including a housing, a micro-structural layer and a fluid. The housing has an inner surface and an enclosed internal space, and includes a bendable section. The micro-structural layer is formed on the inner surface of the hollow housing. The fluid is filled in the internal space. The housing is provided with a channel maintaining structure at the bendable section.

The housing further includes a first end portion and a second end portion at two opposite sides of the bendable section. The internal space is divided into a first space correspondingly in the first end portion, a second space correspondingly in the second end portion, and a communicating space correspondingly in the bendable section.

The housing is formed by a first plate and a second plate. The first plate at the bendable section is a first bending portion. The second plate at the bendable section is a second bending portion.

In one embodiment of the present invention, the channel maintaining structure is formed on the first bending portion and away from the second bending portion, and has a third space in communication with the communicating space.

In another embodiment of the present invention, the channel maintaining structure is formed on the second bending portion and away from the first bending portion, and has a third space in communication with the communicating space.

In another embodiment of the present invention, the channel maintaining structure is formed between the first bending portion and the second bending portion, and includes a plurality of support members arranged at an interval between the first bending portion and the second bending portion so as to maintain the communicating space.

In other embodiments of the present invention, the channel maintaining structure includes a plurality of first ribs formed on the first bending portion, and a plurality of second ribs formed on the second bending portion. The first ribs are arranged at an interval and correspondingly face the second ribs, and the second ribs are arranged at an interval and correspondingly face the first ribs. When the housing is bent, the first ribs and the second ribs press against each other to maintain the communicating space.

Preferably, the micro-structural layer further includes a plurality of micro columns arranged between the first plate and the second plate. The height of the micro columns located at the bendable section is smaller.

The first plate and the second plate are welded around an edge, and the amount of a welding material at the bendable section is more than that at the first end portion and the second portion.

The above objects, technical features and advantages of the invention will become better understood with regard to the following detailed description of the preferred but non-limiting embodiments. The following description is made with reference to the accompanying drawings.

DETAILED DESCRIPTION OF THE EMBODIMENTS

Figure 1:
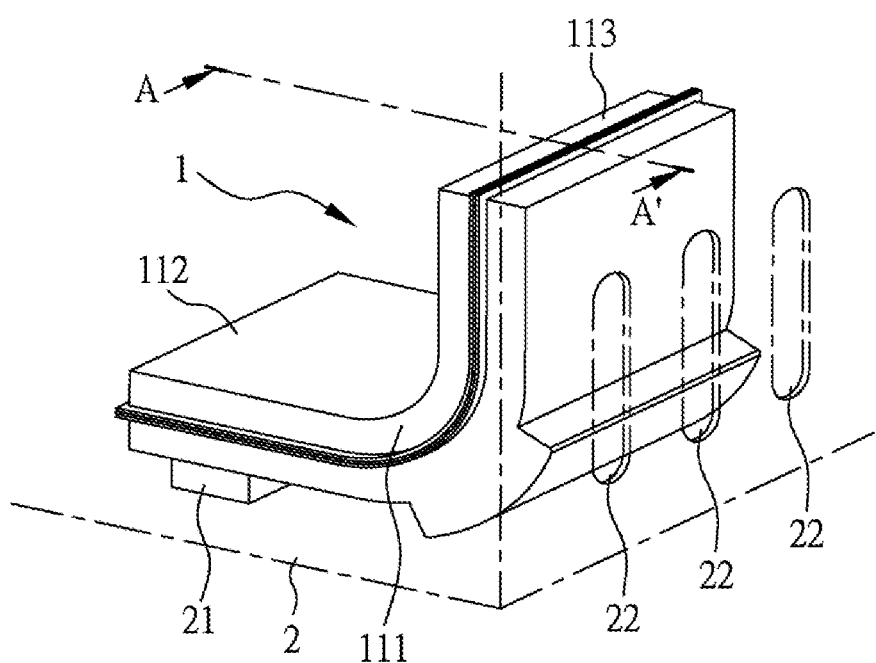
FIG. 1 is a perspective schematic diagram of a bendable heat plate according to a first embodiment of the present invention located in an electronic device.
Figure 2:
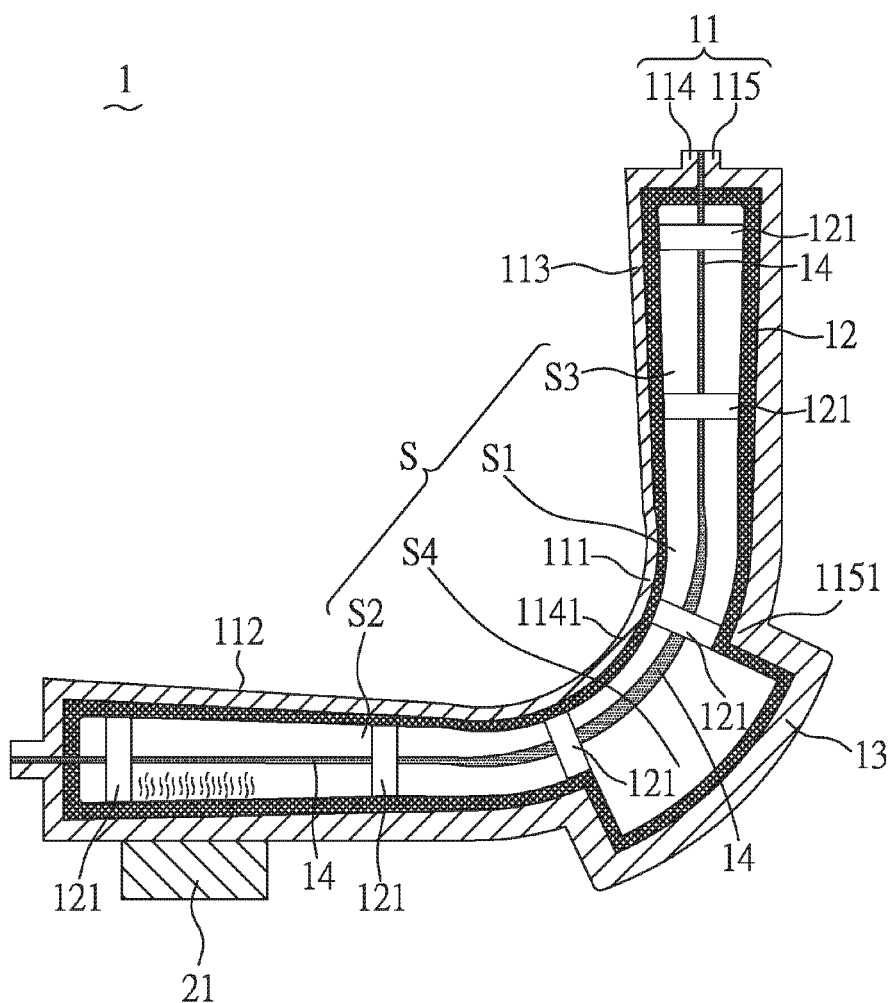
FIG. 2 is a sectional schematic diagram of FIG. 1 along a section line A-A'.

FIG. 1 shows a perspective schematic diagram of a bendable heat plate 1 according to a first embodiment of the present invention located in an electronic device 2. FIG. 2 shows a sectional schematic diagram of FIG. 1 along a section line A-A'. In this embodiment, the bendable heat plate 1 includes a housing 11, a micro-structural layer 12, a channel maintaining structure 13, and a fluid (not shown). From the perspective of the appearance of the housing 11, the housing 11 includes a bendable section 111, a first end portion 112 and a second end portion 113. The first end portion 112 and the second end portion 113 are located at two opposite sides of the bendable section 111, respectively, and are perpendicular to each other. From the perspective of the internal structure of the housing 11, the housing 11 has an inner surface and an enclosed internal space S. The internal space S may be divided into a first space S2 correspondingly in the first end portion 112, a second space S3 correspondingly in the second end portion 113, and a communicating space S1 correspondingly in the bendable section 111. The micro-structural layer 12 is formed on the inner surface, and the fluid is filled in the internal space S.

As shown in FIG. 1 and FIG. 2, FIG. 1 depicts only a partial corner of an electronic device 2 to illustrate a position relationship between the bendable heat plate 1 disposed at the electronic device 2 and the electronic device 2. The first end portion 112 is parallel to the horizontal plane, and is adhered with an electronic component 21 in the electronic device 2. The second end portion 113 is perpendicular to the first end portion 112 (i.e., parallel to the vertical plane). In this embodiment, the second end portion 113 faces a plurality of heat dissipating holes 22 of the electronic device 2. When heat generated by the electronic component 21 is transmitted to the first end portion 112, liquid in the first end portion 112 is transformed into gas by heat (as shown by dotted lines above the electronic component 21 in the first space S2 in FIG. 2), and flows through the communicating space S1 in the bendable section 111 to the second space S3 at the second end portion 113, thus transmitting and dispersing the heat energy of the second end portion 113 through the heat dissipating holes 22 to an exterior. External air similarly comes into contact with the second end portion 113 through the heat dissipating holes 22. When gas flows into the second space S3, due to a distance from the heat source (emitted by the electronic component 21), the temperature of the second end portion 113 is lower, such that the gas is again condensed to liquid, which then flows through the micro-structural layer 12 and the communicating space S1 into the first space S2.

More specifically, the housing 11 is formed by a first plate 114 and a second plate 115. The first plate 114 at the bendable section 111 is a first bending portion 1141, and the second plate 115 at the bendable section 111 is a second bending portion 1151. To compensate the communicating space S1 that is reduced due to the bending of the bendable section 111, in this embodiment, the channel maintaining structure 13 is a hollow protrusion so as to define a third space S4. As shown in FIG. 2, the channel maintaining structure 13 is formed on the second bending portion 1151, and is in communication with the third space S4 via the communicating space S1, such that liquid (or gas) can flow in the communicating space S1 and the third space S4. Thus, even if the communicating space S1 is reduced after bending, the third space S4 is however added, allowing the bendable section 111 to provide a space for the flowing of the liquid and the gas and thus a good heat dissipation effect.

An included angle between the first end portion 112 and the second end portion 113 may be between 0° and 180°. When the included angle between the first end portion 112 and the second end portion 113 is between 0° and 90°, the bendable heat plate 1 on the electronic device 2 has a smaller projection area and a smaller height, reducing the size and thickness of the electronic device 2. In this embodiment, the included angle between the first end portion 112 and the second end portion 113 is 90°; i.e., the first end portion 112 and the second end portion 113 are perpendicular to each other. By adhering the first end portion 112 to the electronic component 21, the heat of the electronic component 21 is transmitted to the first end portion 112, the liquid in the first end portion 112 absorbs heat and is then transformed to gas, and the gas at the same time carries the heat energy, passes through the bendable section 111 and vertically flows to the second end portion 113 to quickly withdraw the heat energy.

The micro-structural layer 12 further includes a plurality of micro columns 121. In this embodiment, the micro columns 121 are formed on the inner surface of the housing 11 and located in the internal space S. The height of the communicating space S1 after the bendable section 111 is bent is smaller than the heights of the first space S2 and the second space S3. Thus, to prevent the micro columns 121 at the communicating space S1 from being pressed and damaged when the bendable section 111 is bent, the heights of the micro columns 121 at the bendable section 111 are made smaller; that is, as shown in FIG. 2, the heights of the micro columns 121 at the first end portion 112 and the second end portion 113 are higher. One advantage of the micro-structural layer 12 is that, for example, after the gas at the second end portion 113 is condensed into liquid, the liquid returns into the first space S2 along the micro-structural layer 12. In addition to a supporting effect, because the micro columns 121 are made by powder sintering and similarly have micro structures at surfaces thereof, the micro columns 121 help the liquid to more quickly return to the heat absorbing area in the first space S2.

Further, edges of the first plate 114 and the second plate 115 are joined by means of welding to form the housing 11. As shown in FIG. 2, during the bending process of the bendable section 111, to prevent the first plate 114 and the second plate 115 from disengaging due to insufficient binding, an amount of a welding material 14 used at the bendable section 111 is larger than an amount of the welding material 14 used at the first end portion 112 and the second end portion 113. For example, in the present invention, an area by which the welding material 14 is adhered to the bendable section 111 can be increased, or the number of layers of the welding material 14 can be increased to effectively reinforce the binding effect between the first plate 114 and the second plate 115 at the bendable section 111, and associated details are omitted herein.

Figure 3:
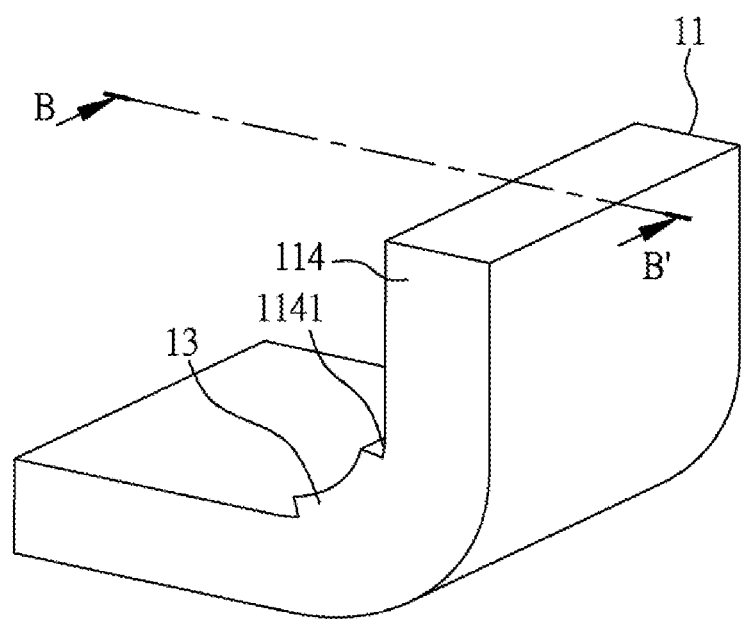
FIG. 3 is a perspective schematic diagram of a bendable heat plate according to a second embodiment of the present invention.
Figure 4:
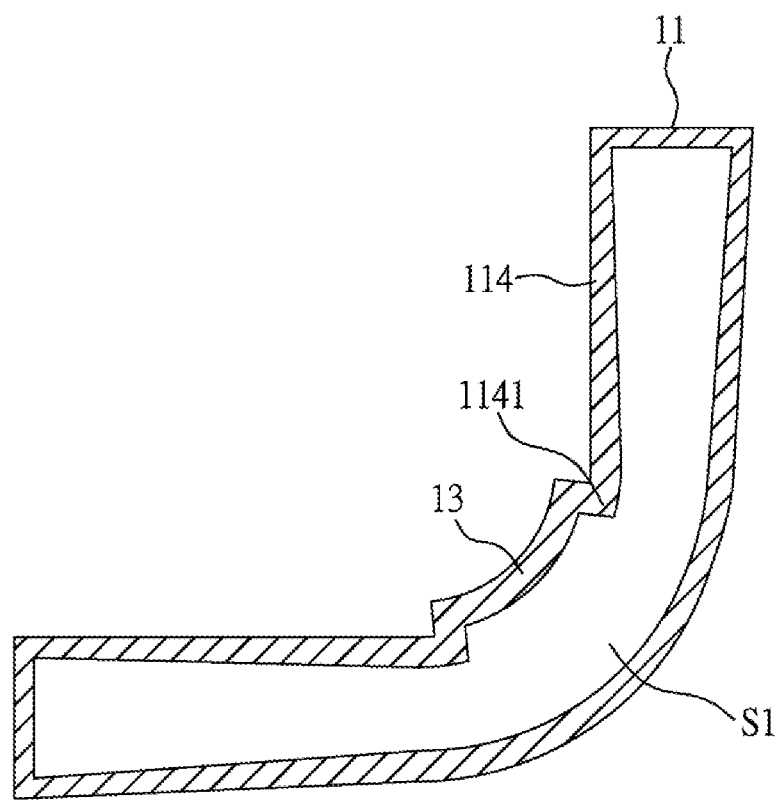
FIG. 4 is a sectional schematic diagram of FIG. 3 along a section line B-B'.

FIG. 3 and FIG. 4 show a bendable heat plate 1 according to a second embodiment of the present invention. FIG. 3 is a perspective schematic diagram according to the second embodiment, and FIG. 4 is a sectional schematic diagram of FIG. 3 along a section line B-B'. This embodiment, similar to the first embodiment, includes a housing 11, a micro-structural layer (not shown), a fluid (not shown) and a channel maintaining structure 13. However, one difference of this embodiment from the first embodiment is that, the channel maintaining structure 13 is a hollow protrusion formed on the first bending section 1141 of the first plate 114. The objects of this embodiment are the same as those of the first embodiment, and the communicating space S1 is mainly expanded through the channel maintaining structure 13, so as to allow the communicating space S1 to be sufficient for the fluid to pass through.

Figure 5:
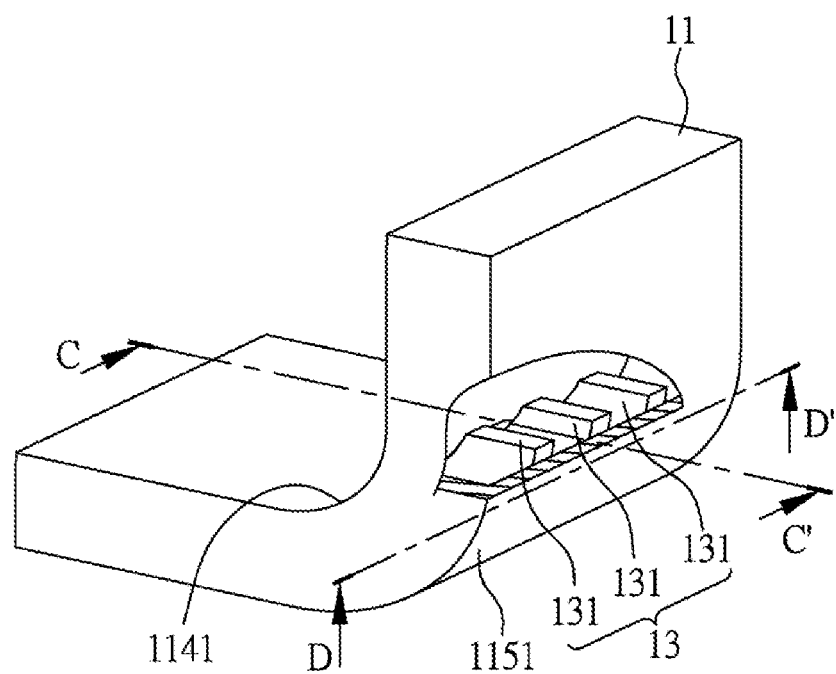
FIG. 5 is a perspective schematic diagram of a bendable heat plate according to a third embodiment of the present invention.
Figure 6:
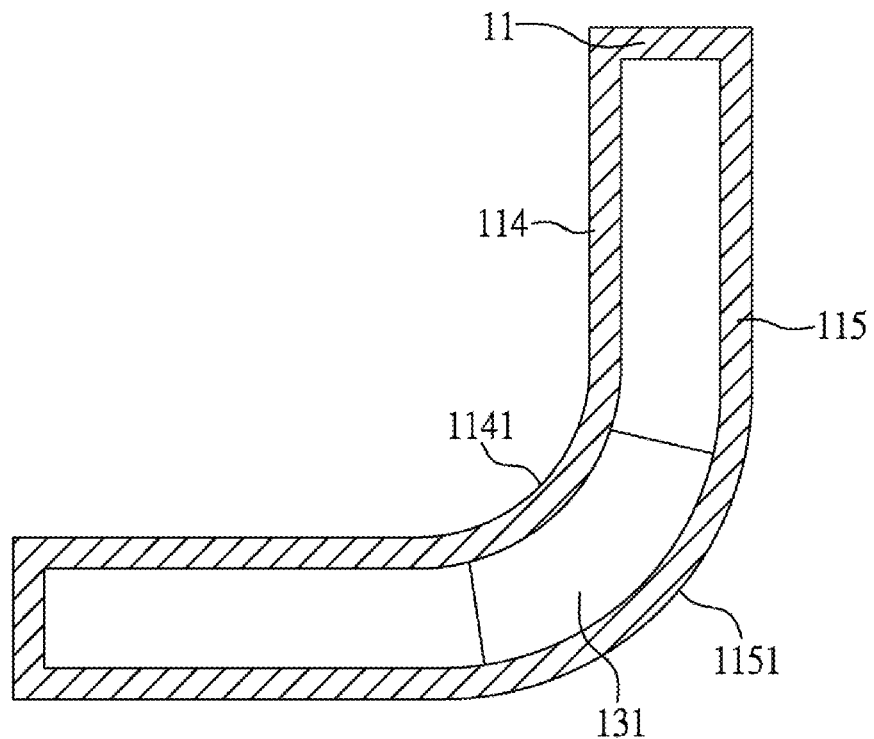
FIG. 6 is a sectional schematic diagram of FIG. 5 along a section line C-C'.
Figure 7:
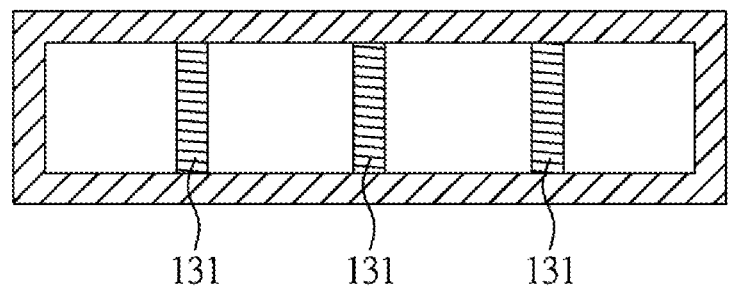
FIG. 7 is a sectional schematic diagram of FIG. 5 along a section line D-D'.

FIG. 5, FIG. 6 and FIG. 7 show a third embodiment of the present invention. FIG. 5 shows a perspective schematic diagram of this embodiment. FIG. 6 shows a sectional schematic diagram of FIG. 5 along a section line C-C'. FIG. 7 shows another sectional schematic diagram of FIG. 5 along a section line D-D'. In this embodiment, the bendable heat plate 1 similarly includes a housing 11, a micro-structural layer (not shown), a fluid (not shown), and a channel maintaining structure 13. However, one main object of the present invention is to ensure that the communicating space S1 at the bendable section 111 of the housing 11 is not compressed after the bendable section 111 is bent, and the fluid is allowed to pass through. Thus, the channel maintaining structure 13 includes a plurality of supporting members 131 arranged at an interval between the first bending portion 1141 and the second bending portion 1151, ensuring that the fluid can flow among the supporting members 131 in the communicating space S1.

Figure 8:
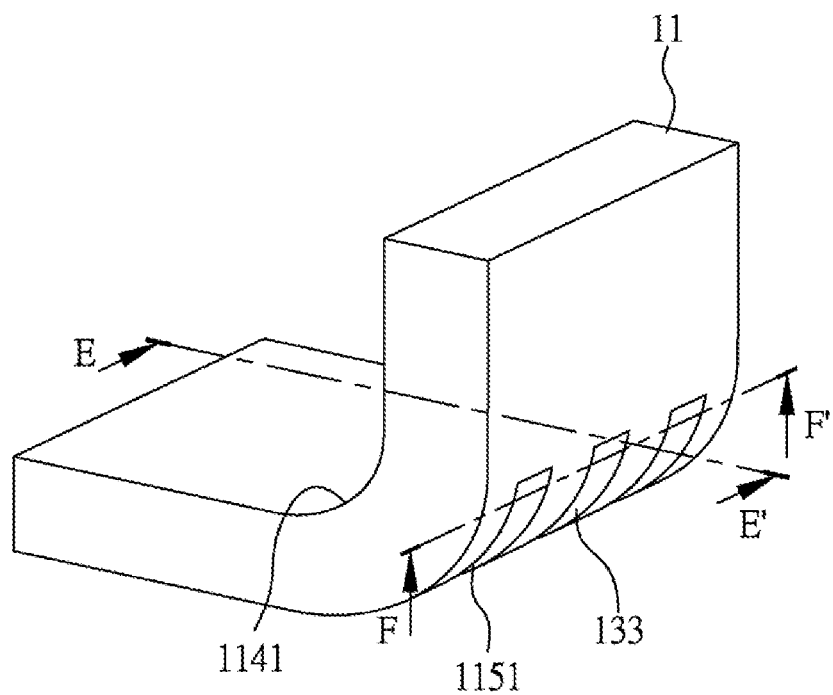
FIG. 8 is a perspective schematic diagram of a bendable heat plate according to a fourth embodiment of the present invention.
Figure 9:
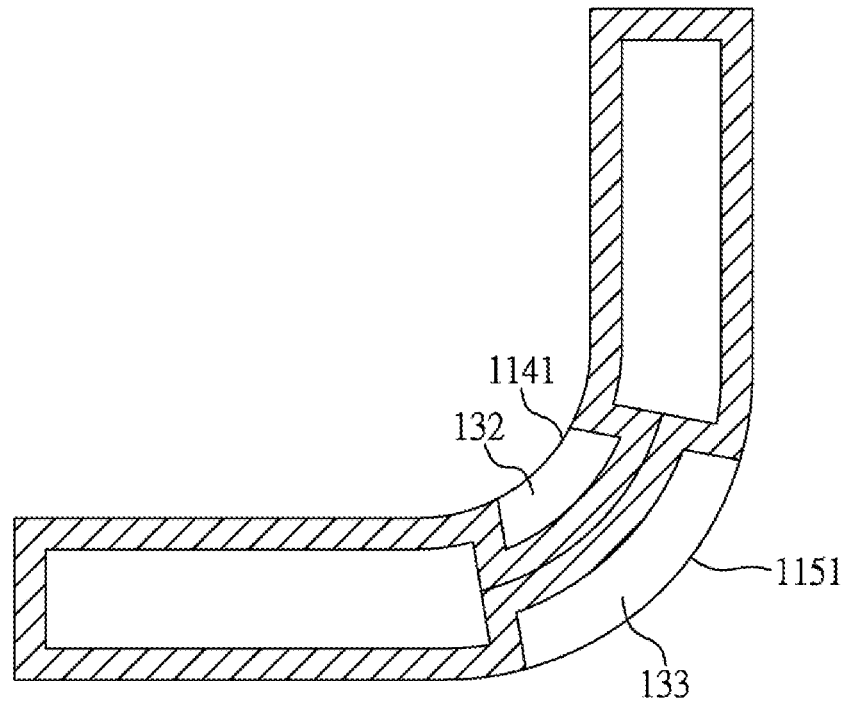
FIG. 9 is a sectional schematic diagram of FIG. 8 along a section line E-E'.
Figure 10:
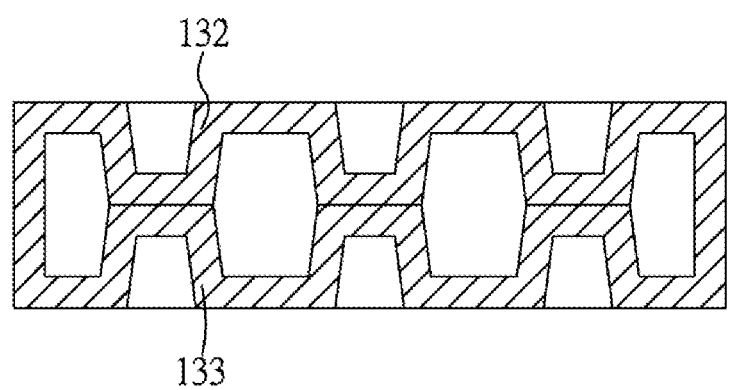
FIG. 10 is a sectional schematic diagram of FIG. 8 along a section line F-F'.

FIG. 8, FIG. 9 and FIG. 10 show a fourth embodiment of the present invention. FIG. 8 shows a perspective schematic diagram of this embodiment. FIG. 9 shows a sectional schematic diagram of FIG. 8 along a section line E-E'. FIG. 10 shows a sectional schematic diagram of FIG. 8 along a section line F-F'. The bendable heat plate 1 includes a housing 11, a micro-structural layer (not shown), a fluid (not shown) and a channel maintaining structure 13. In this embodiment, the channel maintaining structure 13 includes a plurality of first ribs 132 formed on the first bending portion 1141, and a plurality of second ribs 133 formed on the second bending portion 1151. The first ribs 132 are arranged at an interval and correspondingly face the second ribs 133, and the second ribs 133 are arranged at an interval and correspondingly face the first ribs 132. When the housing 11 is bent, the first ribs 132 and the second ribs 133 correspondingly press against one another. Thus, in the communicating space S1, the fluid flows among the first ribs 132 and the second ribs 133. Further, in this embodiment, the first bending portion 1141 and the second bending portion 1151 are embossed to form multiple ribs. As such, the first bending portion 1141 and the second bending portion 1151 appear as multiple grooves arranged at an interval. However, in other embodiments of the present invention, the ribs may be formed by other means, which are not limited by the present invention.

In conclusion, the bendable heat plate of the present invention expands the space at the bendable section through the channel maintaining structure such that the fluid is provided with a sufficient space for flowing, or the communicating space at the bendable section is supported by the channel maintaining structure to prevent the communicating space from collapsing due to the bending. Meanwhile, the liquid in the bendable heat plate of the present invention, after being transformed to gas, can flow along a perpendicular direction from the bending section, thereby accelerating the flowing speed of the gas and enhancing the heat dissipation efficiency.

While the invention has been described by way of example and in terms of the preferred embodiments, it is to be understood that the invention is not limited thereto. Any changes easily made or equivalent arrangements made by one person skilled in the art are to be encompassed within the scope of the present invention. The scope of the present invention should be accorded based on the appended claims.

What is claimed is:

1. A bendable heat plate, comprising:
   a housing having an inner surface and an enclosed internal space, comprising a bendable section, wherein the housing further comprises a first end portion and a second end portion located at two opposite sides of the bendable section, and the internal space is divided into a first space correspondingly in the first end portion, a second space correspondingly in the second end portion, and a communicating space correspondingly in the bendable section, and wherein the housing is formed by a first plate and a second plate, the first plate at the bendable section is a first bending portion, and the second plate at the bendable section is a second bending portion;
   a micro-structural layer formed on the inner surface of the housing; and
   a fluid filled in the internal space;
   wherein the housing is provided with a channel maintaining structure at the bendable section, and
   wherein the micro-structural layer further comprises a plurality of micro columns arranged between the first plate and the second plate, and a height of the micro column located at the bendable section is smaller.

2. The bendable heat plate according to claim 1, wherein the channel maintaining structure is formed on the first bending portion and away from the second bending portion, and comprises a third space in communication with the communicating space.

3. The bendable heat plate according to claim 1, wherein the channel maintaining structure is formed on the second bending portion and away from the first bending portion, and comprises a third space in communication with the communicating space.

4. A bendable heat plate, comprising:
   a housing having an inner surface and an enclosed internal space, comprising a bendable section, wherein the housing further comprises a first end portion and a second end portion located at two opposite sides of the bendable section, and the internal space is divided into a first space correspondingly in the first end portion, a second space correspondingly in the second end portion, and a communicating space correspondingly in the bendable section, and wherein the housing is formed by a first plate and a second plate, the first plate at the bendable section is a first bending portion, and the second plate at the bendable section is a second bending portion;

a micro-structural layer formed on the inner surface of the housing; and a fluid filled in the internal space;

wherein the housing is provided with a channel maintaining structure at the bendable section, and wherein the first plate and the second plate are welded around an edge, and a welding material at the bendable section is more than that at the first end portion and the second end portion.

5. The bendable heat plate according to claim 4, wherein the channel maintaining structure is formed on the first bending portion and away from the second bending portion, and comprises a third space in communication with the communicating space.

6. The bendable heat plate according to claim 4, wherein the channel maintaining structure is formed on the second bending portion and away from the first bending portion, and comprises a third space in communication with the communicating space.

7. The bendable heat plate according to claim 4, wherein the channel maintaining structure is formed between the first bending portion and the second bending portion.

8. The bendable heat plate according to claim 7, wherein the channel maintaining structure comprises a plurality of supporting members arranged at an interval between the first bending portion and the second bending portion so as to maintain the communicating space therebetween.

9. The bendable heat plate according to claim 4, wherein the channel maintaining structure comprises a plurality of first ribs formed on the first bending portion and a plurality of second ribs formed on the second bending portion, the first ribs are arranged at an interval and correspondingly face the second ribs, and the second ribs are arranged at an interval and correspondingly face the first ribs; when the housing is bent, the first ribs and the second ribs correspondingly press against each other to maintain the communicating space therebetween.

* * * * *